United States Patent
Brown et al.

(10) Patent No.: US 6,864,136 B2
(45) Date of Patent: Mar. 8, 2005

(54) DRAM CELL WITH ENHANCED SER IMMUNITY

(75) Inventors: Jeffrey S. Brown, Middlesex, VT (US); David M. Fried, Ithaca, NY (US); Edward J. Nowak, Essex Junction, VT (US); Beth Ann Rainey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/733,671

(22) Filed: Dec. 11, 2003

(65) Prior Publication Data

US 2004/0126969 A1 Jul. 1, 2004

Related U.S. Application Data

(62) Division of application No. 10/064,869, filed on Aug. 26, 2002.

(51) Int. Cl.[7] .............................. H01L 21/8242
(52) U.S. Cl. ...................... 438/239; 438/381
(58) Field of Search ................. 438/239, 240, 438/241, 242, 244, 243, 246, 250, 248, 253, 266, 270, 278, 283, 305, 306, 311, 386, 381, 387, 393, 394, 396

(56) References Cited

U.S. PATENT DOCUMENTS

| | | | |
|---|---|---|---|
| 4,103,342 A | | 7/1978 | Miersch et al. ............. 365/149 |
| 4,641,165 A | * | 2/1987 | Iizuka et al. ................ 257/311 |
| 4,686,552 A | | 8/1987 | Teng et al. ................. 357/23.6 |
| 4,888,733 A | * | 12/1989 | Mobley ...................... 365/145 |
| 4,927,779 A | | 5/1990 | Dhong et al. ................. 428/52 |
| 5,134,616 A | | 7/1992 | Barth Jr. et al. ........... 371/10.3 |
| 5,241,211 A | * | 8/1993 | Tashiro ...................... 257/506 |
| 5,329,479 A | * | 7/1994 | Ota et al. ................... 365/149 |
| 5,567,962 A | | 10/1996 | Miyawaki et al. ......... 257/296 |
| 5,606,189 A | | 2/1997 | Adan ......................... 257/303 |
| 5,780,335 A | | 7/1998 | Henkels et al. ............. 438/243 |
| 5,929,477 A | * | 7/1999 | McAllister Burns et al. .......................... 257/306 |
| 5,943,279 A | * | 8/1999 | Wada ......................... 365/205 |
| 6,064,588 A | * | 5/2000 | Crafts ........................ 365/149 |
| 6,077,745 A | * | 6/2000 | Burns et al. ................ 438/270 |
| 6,101,117 A | | 8/2000 | Tiwari ........................ 365/145 |
| 6,198,151 B1 | * | 3/2001 | Wada ......................... 257/520 |
| 6,246,083 B1 | | 6/2001 | Noble ........................ 257/296 |
| 6,440,801 B1 | * | 8/2002 | Furukawa et al. .......... 438/272 |

OTHER PUBLICATIONS

Choi, Y–K. et al., "30 nm ultra–thin–body SOI Mosfet with selective deposied Ge raised S/D", Jun. 2000, 58th Dev. Res. Conf. (DRC), pp. 23–24.*

* cited by examiner

Primary Examiner—David Nhu
(74) Attorney, Agent, or Firm—Robert A. Walsh

(57) ABSTRACT

A memory cell that has first and second fully depleted transfer devices each having a body region and first and second diffused electrodes. The cell has a differential storage capacitor having at least one node abutting and in electrical contact with one of the first and second diffused electrodes of each of the transfer devices. The storage capacitor has a primary capacitance and a plurality of inherent capacitances, wherein the primary capacitance has a capaictive value that is at least approximately five times greater than that of the plurality of inherent capacitances.

4 Claims, 6 Drawing Sheets

DRAM CELL WITH ENHANCED SER IMMUNITY

This application is a division of application Ser. No. 10/064,869, filed Aug. 26, 2002, which is currently pending.

BACKGROUND OF THE INVENTION

1. Technical Field

The invention relates generally to DRAM cells, and more specifically to a cell with enhanced SER immunity.

2. Background Art

A standard dynamic random access memory (DRAM) cell features a capacitor with one electrode coupled to ground potential and one electrode coupled to a source/drain electrode of a FET transfer device that has a gate electrode coupled to a word line and the other source/drain electrode coupled to a bit line. If the FET is an NFET, when the word line voltage rises the charge from the capacitor alters the voltage of the bit line sufficiently to be sensed by a differential amplifier.

One of the failure mechanisms for DRAM cells are errors due to extraneous charges that disrupt the charge stored on the capacitor. Such mechanisms are referred to as "soft errors," because the radiation (such as alpha rays) that disrupts the charge stored on a capacitor does little to no physical damage. Typically such disruptions are dealt with by error correction codes (ECC), most commonly double error detect, single error correct (DED/SEC) Hamming codes that detect such bit storage errors and fix them on the fly. In fact some DRAMs are architected to include on-chip ECC circuitry so that the Hamming code methodology is carried out on on-chip. See for example U.S. Pat. No. 5,134,616, "Dynamic RAM with On-Chip ECC and Optimized Bit and Word Redundancy," assigned to the assignee of the present invention.

However, in some applications ECC coding is not a practical solution to the problem of soft errors. One such application is embedded DRAM, in which an array of DRAM cells is embedded within a logic circuit. In such applications, the overhead costs associated with ECC are not economically justifiable; that is, the incremental cost of adding DRAM to a logic circuit becomes much more difficult to justify if ECC must be factored in.

One way of increasing soft error immunity without using ECC is to simply increase the size of the capacitance, e.g. using trench capacitors, stacked capacitors, or simply increasing the amount of chip surface area devoted to the capacitor. However, all of these solutions greatly increase the total area of the cell or drive increased process complexity, both of which increase manufacturing cost.

Another solution to reducing soft error rates (SER) is to utilize the so-called "differential" DRAM cell, in which two transistors are coupled to a common, floating capacitor. See U.S. Pat. No. 4,103,342, "Two-Device Memory Cell With Single Floating Capacitor," assigned to the assignee of the present invention, and FR 2595160, "Coupled Memory Cell and Dynamic Memory Containing Such a Cell."

In some art, the notions of trench or stacked capacitors have been combined with the differential DRAM cell concept to further reduce SER. See "High Density Memory Cell Structure With Two Access Transistors," IBM Technical Disclosure Bulletin Vol. 31, No. 7, December 1988 pp. 409–417; U.S. Pat. No. 4,927,779, "Complementary Metal-Oxide-Semiconductor Transistor and One-Capacitor Dynamic-Random-Access Memory Cell and Fabrication Process Therefor;" U.S. Pat. No. 5,580,335, "Method of Forming a Buried-Sidewall-Strap Two Transistor One Capacitor Trench Cell." Other art has combined the two device cell concept with stacked capacitors. See U.S. Pat. No. 5,606,189, "Dynamic RAM Trench Capacitor Device With Contact Strap."

An FET technology that has received much recent attention is the so-called "FinFET" technology, in which a fin of silicon is defined on an SOI substrate, the fin having first and second lateral ends that are doped to form source/drain regions, and a central portion providing the FET channel. This central region is covered with polysilicon to form the gate electrode, and since gate electrode covers both major surfaces of the fin to form a "double gate" structure, the silicon body can be fully depleted of minority carriers to thus provide enhanced switching speeds. See e.g. "A Fully Depleted Lean-Channel Transistor (DELTA)," Hisamoto et al, International Electron Devices Meeting (IEDM)1989, paper 34.5.1, pg 833–36; and "Ultra-thin Body SOI MOSFET for Deep-sub-tenth Micron Era," Choi et al, Department of Electrical Engineering and Computer Sciences, University of California at Berkeley, IEDM 1999, Paper 3.7.1, pp. 919–21.

More recently, similar devices have been proposed as the transfer device for a single-capacitor DRAM cell. See U.S. Pat. No. 6,246,083, "Vertical Gain Cell and Array for a Dynamic Random Access Memory."

While many of the foregoing teachings seek to address SER by increasing cell capacitance, the methods utilized to do so (greatly increasing cell area, and/or increasing the structural complexity of the capacitor) are suboptimal, particularly in applications such as embedded DRAM in which we seek to minimize the processing variances between the DRAM array and the surrounding logic. Therefore, a need has developed for a DRAM cell that has enhanced SER immunity and is of simple construction.

SUMMARY OF THE INVENTION

It is thus an object of the present invention to provide a two-device DRAM cell that has enhanced SER immunity and is of simple construction.

The foregoing and other objects of the invention are realized, in a first aspect, by a memory cell that has first and second fully depleted transfer devices each having a body region and first and second diffused electrodes. The cell has a differential storage capacitor having at least one node abutting and in electrical contact with one of the first and second diffused electrodes of each of the transfer devices. The storage capacitor has a primary capacitance and a plurality of inherent capacitances, wherein the primary capacitance has a capacitive value that is at least aproximately five times greater than that of the plurality of inherent capacitances.

In another aspect, the invention is a differential DRAM cell, comprising a plurality of rails of semiconductor material formed on a semiconductor substrate, each rail having source and drain diffusions therein separated by respective fully depleted channel regions that are controlled by a gate electrode to form a transistor, each of the drain diffusions being coupled to a first node of a differential capacitor disposed on adjacent ones of the plurality of rails, at least one of the adjacent ones of said plurality of rails having a storage dielectric disposed on said first node, and a plate electrode of said differential capacitor being disposed on said storage dielectric.

A further aspect of the invention is a method of forming a memory cell, comprising forming a plurality of rails of semiconductor material on a substrate; doping a first portion of the rails; forming a dielectric on said first portion of at least every other one of the rails; forming a plate electrode on the first portion of adjacent pairs of the rails; forming an FET in a second portion of the rails adjacent the first portion, the FET having a gate electrode disposed on all exposed sides of a part of the second portion of said rails; and forming a plurality of conductors orthogonal to the rails and contacting said gate electrodes.

DESCRIPTION OF THE DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION OF THE PREFERRED EMBODIMENTS OF THE INVENTION

Figure 1:
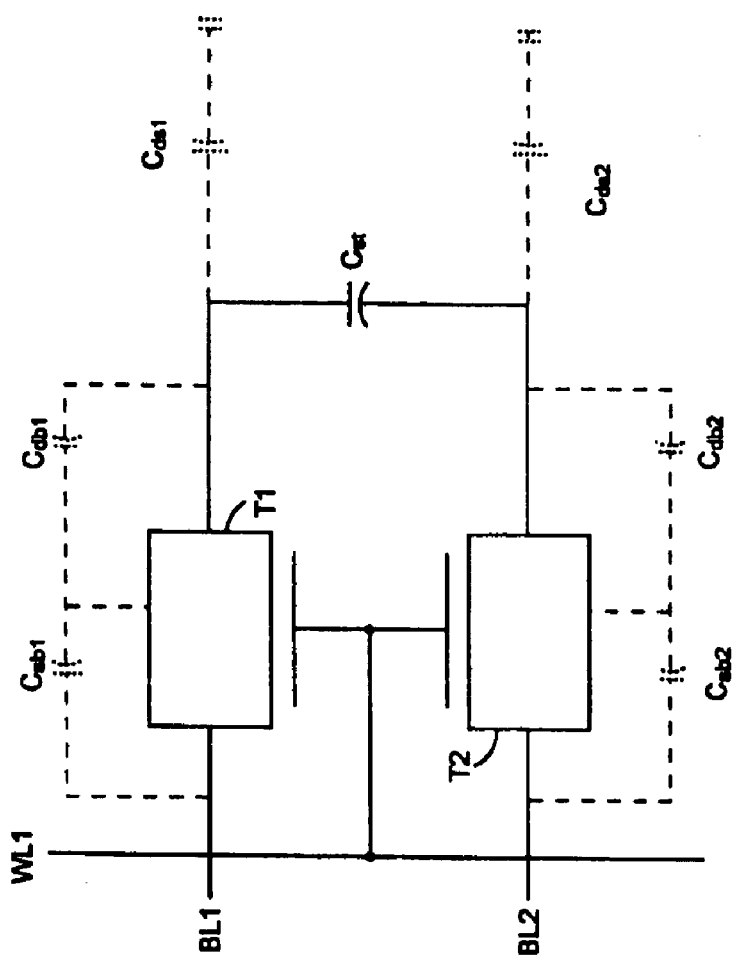
FIG. 1 is a schematic view of the memory cell of the present invention.

FIG. 1 is a schematic view of a differential DRAM cell, having transfer devices T1 and T2 coupled to a word line WL1, each device having a first source/drain electrode coupled to a respective bit line BL1, BL2. In the invention, the storage capacitor comprises two active nodes with a single conductor overlying them.

The present inventors have recognized that in such a configuration, with a floating storage capacitor having its storage node coupled to the drain electrodes of the transfer devices T1, T2, a number of inherent capacitors are part of the cell. These capacitors (illustrated by hatched lines in FIG. 1) are "inherent" in the sense that they are not capacitors that are intentionally formed as such; rather, they are an inherent part of the cell with a floating storage capacitance configured as set forth in FIG. 1. The first source of inherent capacitance is the junction capacitance developed between the diffused electrodes of each transfer device T1, T2 and the (conducting) charge-neutral region of the body of each transfer device. This feature results in the junction capacitances indicated in FIG. 1 as Csb1, Cdb1, Csb2, and Cdb2. In a 0.09 micron (um) groundrule technology, these capacitances each have a capacitive value between approximately 0.3 fF/um and 0.7 fF/um. The second source of inherent capacitance is due to typically large areas of drain forming a junction to the substrate, in non-SOI art, or forming a large area parallel to the wafer in the case of an SOI design. This feature results in the junction capacitances indicated in FIG. 1 as Cds1, Cds2. In both cases, the large drain faces parallel to the substrate add inherent capacitance, typically between 0.2 fF/um2 and 1.0 fF/um2 in a 0.09 micron groundrule technology.

The problem presented by these inherent capacitances is as follows. When a "1" is written to the cell, the charge is shared between the storage capacitance Cst and all of the inherent capacitances shown in FIG. 1. Thus, when a given transfer device (e.g., T1) experiences a radiation event, the inherent capacitances Csb1, Cdb1, and Cds1 discharge some of the stored charge since that charge was partially stored thereon. With the capacitive values given above, the inherent capacitances store sufficient charge such that the remaining charge stored by Cst after a radiation event may not be sufficient to be reliably sensed. Therefore, in order to minimize the disturbance of the stored charge, it would be helpful to minimize the capacitive value of the inherent capacitances relative to the storage capacitor.

In the present invention, the transfer devices are constructed and operated such that their bodies are fully depleted of any charge-neutral zone. This has the effect of reducing the junction capacitances of the diffused electrodes of the transfer device, which in turn reduces the capacitive values of the inherent capacitances.

Figure 2:
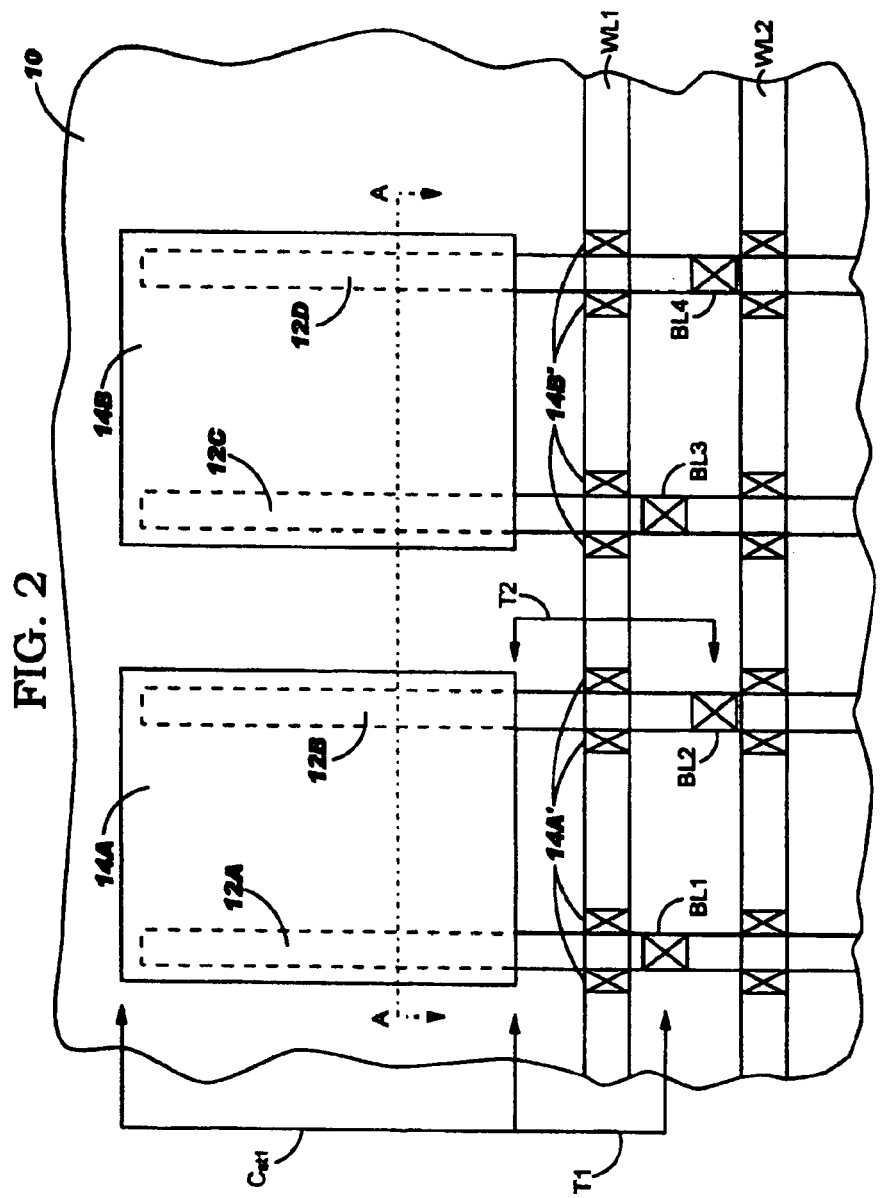
FIG. 2 is a top view of the memory cell in accordance with a first preferred embodiment of the present invention.

FIG. 2 is a top view of the memory cell in accordance with a first preferred embodiment of the present invention. Like reference numerals in FIGS. 1 and 2 refer to like structures. A plurality of thin, fin-like semiconductor rails 12A–12D are formed on a substrate 10. In practice, substrate 10 can be made of silicon and other semiconductor materials as described below. It is preferred that the substrate 10 be a silicon-on-insulator (SOI) substrate, with a buried oxide (or BOX) structure that separates the semiconductor bodies 12A–12D from the bulk substrate 10. At this stage of the process, the substrate 10 will have a single semiconductor layer of uniform thickness above the BOX, with the remainder (or bulk) of the substrate below the BOX. Note that this structure helps reduce the inherent capacitances Cn1g, Cn2g, by isolating the drain diffusions of T1, T2 from the bulk semiconductor below the buried oxide.

The semiconductor rails or fins 12A–12D can be formed in accordance with the teachings of the Hisamoto et al and Choi et al papers referenced above. In such structures, the channel region extends through the entire body, such that the gate electrode (which wraps around the body) fully depletes the body of charge carriers when in operation. It is preferred to form the rails by depositing a hard-mask material, preferably silicon dioxide, on the silicon-on-insulator wafer, and then forming a mandrel above the hardmask material (in practice, the mandrel can be a layer of polysilicon that is patterned by etching through a conventional photoresist pattern). Then sidewall spacers, preferably made of silicon nitride, are formed on the sides of the mandrel e.g. by depositing silicon nitride on the mandrel and then anisotropically etching it in a reactive ion etch (RIE) using conventional techniques. Note that while silicon dioxide, polysilicon, and silicon nitride are preferred, in practice any set of materials can be used that can be differentially etched as described below. In the next set of steps, the mandrel is removed without removing the spacers (e.g. in a RIE with HBr as the etching species, which removes silicon at a rate much faster than silicon dioxide). The spacers (about 35–100 angstroms wide) are then used as masks to etch the exposed portions hardmask above the semiconductor (which in turn is above the BOX in substrate 10). The spacers are then selectively removed (typically with CH3F as the etching species), leaving the hardmask behind. A 'trim' mask (TR) is next used to selectively remove portions of the hardmask material where desired, and the mask then removed. This allows the 'loops' of hardmask to be broken. Next a silicon etch with high selectivity to the hardmask is performed, such that only those portions of silicon beneath the patterned hardmask remain on the BOX. The semiconductor bodies 12A–12D are elongated rails with which both the transfer devices and the storage capacitors of the invention are formed. As a practical matter, while the invention can be formed in any semiconductor, including e.g. gallium arsenide and other Group III–V materials and alloys thereof, the preferred semiconductors of the invention are silicon, germanium, and Si—Ge alloys.

Next, after growing a sacrificial oxide, typically by 2.0 to 3.5 nm thermal oxidation of the exposed silicon surfaces, implantation of boron or other dopant atoms into the fins may be performed to adjust the threshold voltages of the transfer FETs. Doping concentrations of $8 \times 10^{18}$ to $8 \times 10^{18}$ cm$^{-3}$ are typically used when the gate electrode material (to follow) is doped polysilicon.

An implant sequence is carried out so that portions thereof can serve as one of the plates of the storage capacitor. Specifically, an implant mask is first applied such that portions of the rails are masked except those that are within the region Cst1 as shown in FIG. 2. The implant mask can be a layer of silicon nitride that is deposited and then etched through a photolithographic mask, or it could be a photolithographic mask itself. Then a low energy, high concentration implant is carried out to render the exposed portions of the rails conductive. Phosphorous, boron, arsenic, or any other conductivity-enhancing implant could be used. A phosporus implant is preferred, at a concentration in the range of 1 times 10 to the 20th power per centimeter cubed (abbreviated as $1 \times 10^{20}/\text{cm}^{-3}$) and an energy in the range of 1 to 3 kilovolts (kev) and is typically angled 30 to 45 degrees off of the axis perpendicular to the wafer plane and at four or more orientations of the wafer in order to ensure that all orientations of fins receive sufficient ion dose. Note that the concentration and energy of this implant is equal to or greater than that subsequently utilized to form the source/drain diffused electrodes of transfer devices TR1, TR2.

Figure 3:
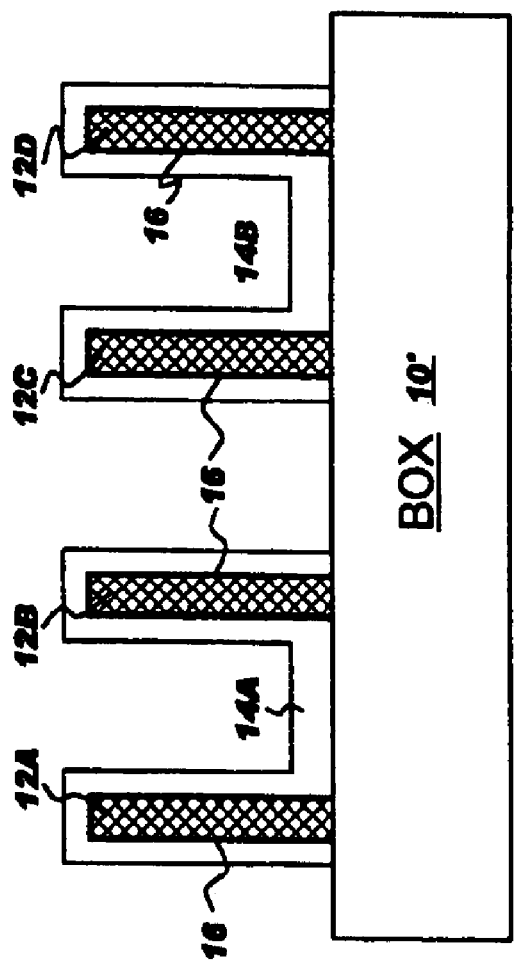
FIG. 3 is a cross-sectional view of the first preferred embodiment of the present invention taken along line A—A of FIG. 2.

Then the sacrificial oxide is removed and an insulator is grown that will provide the gate dielectric for the FETs formed on the rails as well as the capacitor dielectric for the storage capacitors (see capacitor dielectrics 16 in FIG. 3). Gate conductor (electrode) material is next deposited, patterned and etched simultaneously to form both the gates of the transfer devices (i.e. the wordlines) and a coupling layer (14A,B) to complete a differential capacitance between pairs of rails.

Alternatively, if greater storage capacitance is desired, the gate material can be completely removed over the rails as well, and the exposed gate dielectric removed. A material, such as hafnium dioxide can be deposited and patterned to remain over the drains so that the dielectric constant of the storage capacitor's dielectric is greater than that of the gate dielectrics of the transfer devices. Next a conductive layer, such as n+–doped polysilicon, is deposited and patterned to complete the differential capacitor between pairs of rails.

The storage capacitors of the invention are formed by plates 14A, 14B overlying bodies 12A and 12B, 12C and 12D, respectively. See FIG. 3. The plates are separated from the respective bodies by the capacitor dielectric 16, formed as described above. A second conductor portion 14A', 14B' lies above separate portions of 12A and 12B, 12C and 12D, respectively, to form the gate electrodes of transistors T1 and T2. Note that in practice the plates 14A, 14B, and conductor portions 14A', 14B' can be made from a single conductive layer (such as polysilicon or a refractory metal silicide) that is deposited and etched to form the discrete portions as depicted. As such, each conductive portion substantially surrounds the rails on which they are formed; in the case of the transistors T1 and T2, the resulting gate electrodes surround the body region in which the channel is formed, so that the channel is fully depleted of any charge-neutral zone when the transistors are conductive. After these respective conductors are defined by etching, source/drain implants are carried out to complete formation of the transistors T1, T2 shown in FIG. 2.

A plurality of bit line conductors (not shown) is disposed in parallel on top of and overlaying each of bodies 12A–12D, orthogonal to WL1 and WL2. These conductors lay above 14A', 14B' to interconnect pairs of transfer devices to a pair of bit lines. In practice, the bit-lines are typically a first layer of metal (such as copper, aluminum, tungsten, or other conductors) that lays on a passivation layer (not shown) disposed on the entire surface of substrate 10, including being disposed on bodies 12A–12D and conductors 14A', 14B'. Vias (or contacts) are formed through this passivation layer to interconnect each bit line to its respective semiconductor source 12A–12D at bit line contacts BL1–BL4, respectively (as shown schematically by the X's inside 12A–12D).

This portion of the structure is preferably formed by use of the so-called "damascene" process, in which holes are first etched into the passivation layer, as defined by a conventional photoresist process; metal is deposited on the etched passivation layer, filling the holes; excess metal above the upper surface of the passivation layer is removed by conventional chemical-mechanical polishing techniques; and a second layer of metal is separately deposited and etched on the surface of the passivation layer to interconnect the vias. The metal depositions can be chemical vapor depositions; for copper or copper alloys, electroplating is preferred. The passivation layers can be phosphosilicate glass (PSG), borophosphosilicate glass (BPSG), or low dielectric constant materials such as fluorine-doped glass (FSG) and organic materials such as the "SiLK" materials sold by DuPont and the "Black Diamond" material sold by Applied Materials Corp. for use with their deposition tools. Another alternative is the so-called "dual damascene" process, in which the second layer of metal on top of the vias is defined by the same overall passivation apply-etch-deposit-CMP process as for the vias as described above.

Again, these additional conductors are actually disposed on a passivation layer (not shown) disposed on the entire surface of substrate 10, including being disposed on bodies 12A–12D and conductors 14A', 14B'. The overall process will be the same or similar to that described in the paragraph immediately above.

Note also that the mirror image of the depicted structure is formed at the bottom of FIG. 2; the start of this mirror image is indicated by WL2, and is not shown in detail for ease of illustration.

Finally, note from FIG. 2 that the transfer devices have a dual-gate construction (that is, the gate 14A' wraps around the portion of the rail that forms the channel of the FET), such that the channel region can be fully depleted of any charge-neutral zone. The inventors found that the transistors configured in this manner exibit a great decrease in junction capacitance at the diffused electrodes of the FET as compared to that of conventional FETs. The inventors believe that similar decreases in junction capacitance may be provided by other dual-gate FET technologies, or other technologies in which the channel is fully depleted of minority carriers, although the reduction may not be as great.

The fully depleted transfer devices of this invention are designed to be devoid of any charge neutral region by making the body narrow so that the gate electrodes always deplete the entire body of any charge-neutral zone. As a result the first set of junction capacitances Csd1, Cdb1, Csd2, and Cdb2 as shown in FIG. 1 are eliminated, leaving a residual junction capacitance for each transfer device directly from drain to source which is typically 0.05 fF/um to 0.1 fF/um. Also, as a result the second set of junction capacitances Cds1, Cds2 are greatly reduced because in the invention only a very small, sublithographically defined face is parallel to the wafer substrate, resulting in equivalent inherent capacitances that are 5 to 10 times lower than those previously described.

A further improvement to the ratio of the storage capacitance to the inherent capacitance is afforded by the inventive structure by further increasing the height of the silicon rails, such that the capacitance of the storage capacitor increases relative to that of the total inherent capacitances. Specifically, in a 0.09 micron groundrule technology, as the height of the rails is increased above approximately 0.15 microns, the area of the storage capacitance increases relative to that of the inherent capacitors, because the area of the inherent capacitors is independent of rail height. The rail height at which the ratio is enhanced will decrease (i.e. scale) with the smaller groundrules of later technologies.

As a result, the capacitive value of the inherent capacitances is reduced to approximately 20% of the capacitive value of the storage capactitor Cst, which is low enough to prevent the cell from being misread due to a radiation event. A DRAM cell is typically designed with sufficient margin to allow for loss of up to 20% of the signal originally stored in the cell. When ionizing radiation of sufficient magnitude is incident on that differential node which is above the bit line potential (ground in this example), that node will be discharged to ground. The opposite node will be reduced in potential as a function of the relative capacitances of the inherent capacitors and the storage capacitor. With the capacitance of the inherent capacitors only being approximately 20% of the storage capacitance, the lost signal in this case will be approximately 16%, or within the 20% margin design point for the cell. As a result, in the event of a soft error the storage cells of the invention can still be reliably sensed by sense amplifiers that sense the cell signal by voltages on the bit lines coupled to bit line contacts BL1, BL2 shown in FIG. 2.

Figure 4:
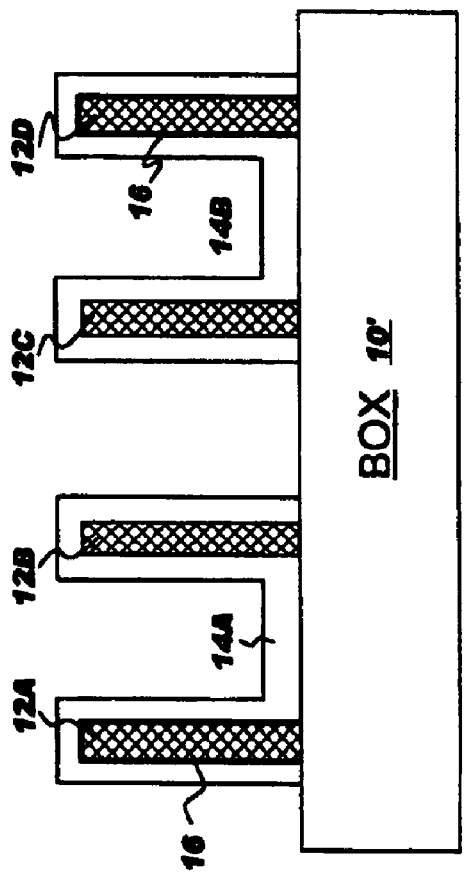
FIG. 4 is a cross-sectional view of the second preferred embodiment of the present invention taken along line A—A of FIG. 2.

FIG. 4 is a cross-sectional view of the second preferred embodiment of the present invention taken along line A—A of FIG. 2. Note that in this embodiment, there is no dielectric formed on the portions of rails 12B and 12C in the storage capacitor portion. This can be accomplished in several ways. One way is to apply a mask on only the depicted portions of rails 12B and 12C that remains in place throughout the process of forming the dielectric. Another method would be after the completion of the dielectric formation process, mask all the rails other than the depicted portions of rails 12B and 12C, and then carry out an etch process to remove any dielectric from the exposed portions of the rails. The latter process is preferred. As a result, the capacitance of the storage capacitor is enhanced, because the charge plate has been made larger. Note that this increase in size is achieved without increasing the surface area of the cell devoted to the storage capacitor. Note also that this increase in storage capacitance is achieved without use of trench capacitors or stacked capacitors.

Figure 5:
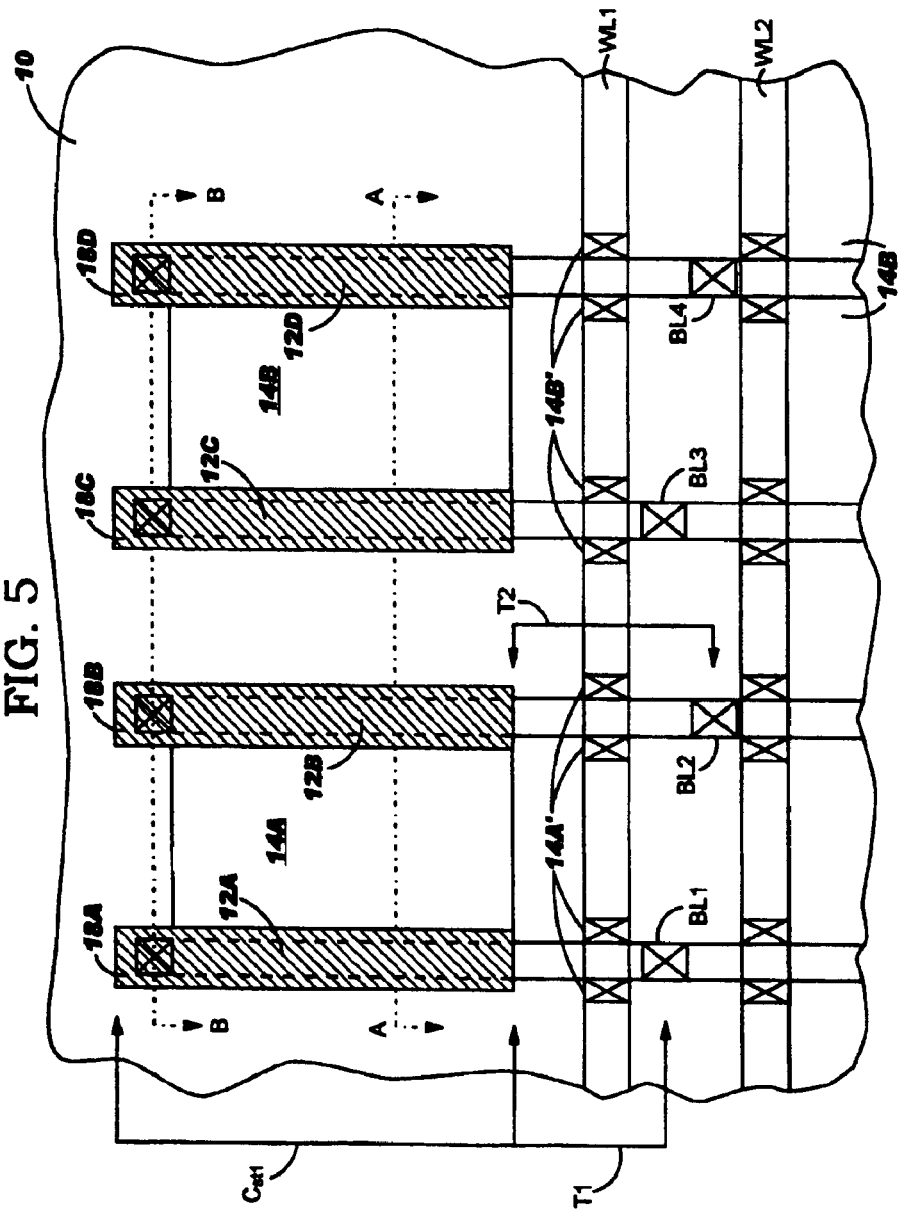
FIG. 5 is a top view of the memory cell in accordance with a third preferred embodiment of the present invention.

FIG. 5 is a top view of the memory cell in accordance with a third preferred embodiment of the present invention. For the most part, this embodiment is similar to the embodiment shown in FIG. 2 (like reference numbers refer to like structures). This embodiment differs in that the storage capacitance is enhanced by adding capacitance, in this case by the use of an additional plates 18A–18D that contact respective ones of the rails 12A–12D at the locations indicated by an X inside the plates 18A–18D, respectively.

Figure 6:
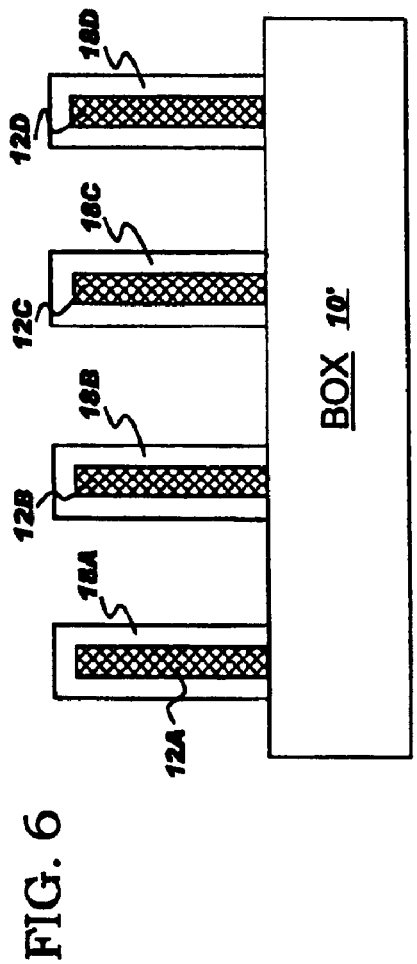
FIG. 6 is a cross-sectional view of the third preferred embodiment of the present invention taken along line B—B of FIG. 5.

FIG. 6 is a cross-sectional view of the third preferred embodiment of the present invention taken along line B—B of FIG. 5. This cross section, taken where the contact is made between the additional plates 18A–18D and the rails 12A–12D, simply shows the contact between the two. Note there is no capacitor dielectric in this region; any layers between rails 12A–12D and plates 18A–18D are removed in these contact areas prior to formation of the plates 18A–18D as described below.

Figure 7:
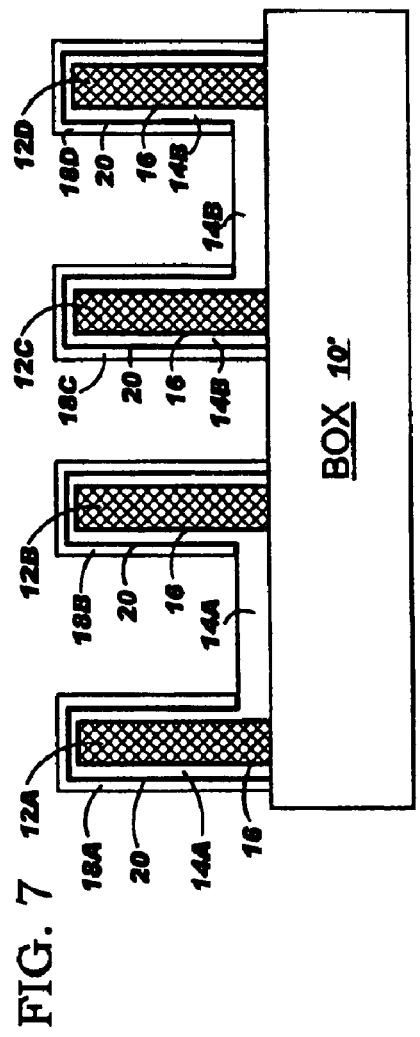
FIG. 7 is a cross-sectional view of the third preferred embodiment of the present invention taken along line A—A of FIG. 5.

FIG. 7 is a cross-sectional view of the third preferred embodiment of the present invention taken along line A—A of FIG. 5. The rails 12A–12D, storage dielectric 16, and plates 14A, 14B are as shown in FIG. 3. In this embodiment, a second dielectric 20 is formed on the exposed surfaces of 14A, 14B, and an additional plate 18A–18D is formed on the second dielectric 20. This plate 18A–18D is coupled to the respective rails 12A–12D, as shown in FIG. 6, so that the storage capacitor has increased capacitance. Recall that in the previous embodiment, the dielectric 16 for the storage capacitors can be formed at the same time as the gate dielectrics for the FETs. In this embodiment, both the storage dielectric 16 and the plates 14A, 14B are formed by themselves, with the implant mask that protects the FET areas still in place. Then the dielectric 20 and the plates 18A–18D are formed at the same time as the gate dielectric and the gate electrodes for the FETs, respectively, as previously described. Note that unlike plates 14A, 14B, the plates 18A–18D do not have a horizontal portion that spans between adjacent rails. This portion is removed during a masked etch, which also removes portions of dielectric 20 from the lower horizontal surface of plates 14A, 14B.

Thus, by use of the invention, DRAM cells with enhanced soft error immunity are provided, without the use of techniques such as ECC, trench capacitor designs, or stacked capacitor designs, and without increasing the surface area devoted to the storage capacitors. The capacitive value of inherent capacitors arising from the coupling of the drains of the FET transfer devices to the capacitor storage nodes is reduced, such that stray radiation does not induce a discharge path sufficient to alter the state of the stored charge in an amount sufficient to result in an erroneous read.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A method of forming a memory cell, comprising:
   forming rails of semiconductor material on a substrate;
   doping a first portion of said rails;
   forming a dielectric on said first portion of at least every other one of said rails;
   forming a plate electrode on said first portion of adjacent pairs of said rails;
   forming an FET horizontally along a second portion of said rails adjacent to said first portion which contain the FET source and drain, said FET having a gate electrode disposed on all exposed sides of a part of said second portion of said rails.

2. The method of claim 1, wherein said substrate comprises a SOI substrate having a buried insulator layer, and wherein said rails are disposed on and contact said buried insulator layer.

3. The method of claim 1, wherein dielectic is formed on said first portions of all of said rails on which a memory cell is to be formed.

4. The method of claim 3, wherein said rails have a height of at least approximately 0.15 microns.

* * * * *